United States Patent
Makiyama et al.

(10) Patent No.: US 7,223,645 B2
(45) Date of Patent: May 29, 2007

(54) SEMICONDUCTOR DEVICE WITH MUSHROOM ELECTRODE AND MANUFACTURE METHOD THEREOF

(75) Inventors: Kozo Makiyama, Kawasaki (JP); Naoya Ikechi, Yamanashi (JP); Takahiro Tan, Yamanashi (JP)

(73) Assignees: Fujitsu Limited, Kawasaki (JP); Fujitsu Quantum Devices Limited, Yamanashi (JP)

( * ) Notice: Subject to any disclaimer, the term of this patent is extended or adjusted under 35 U.S.C. 154(b) by 59 days.

(21) Appl. No.: 10/768,092

(22) Filed: Feb. 2, 2004

(65) Prior Publication Data

US 2004/0152289 A1    Aug. 5, 2004

Related U.S. Application Data

(62) Division of application No. 10/084,924, filed on Mar. 1, 2002, now Pat. No. 6,717,271.

(30) Foreign Application Priority Data

Aug. 3, 2001  (JP) ............................. 2001-236301
Jan. 29, 2002  (JP) ............................. 2002-019361

(51) Int. Cl.
 *H01L 21/338* (2006.01)
 *H01L 21/44* (2006.01)
(52) U.S. Cl. ...................... 438/182; 438/574; 438/949; 438/950; 257/E21.205; 257/E21.455; 257/E21.638
(58) Field of Classification Search ................ 438/167, 438/182, 574, 579, 751, 949, 950; 257/E21.205, 257/E21.455, E21.638
See application file for complete search history.

(56) References Cited

U.S. PATENT DOCUMENTS

| | | | | |
|---|---|---|---|---|
| 4,224,089 A | * | 9/1980 | Nishimoto et al. ......... | 438/197 |
| 4,824,767 A | * | 4/1989 | Chambers et al. .......... | 430/313 |
| 4,959,326 A | * | 9/1990 | Roman et al. .............. | 438/574 |
| 5,185,277 A | * | 2/1993 | Tung et al. ................. | 438/579 |
| 5,712,175 A | * | 1/1998 | Yoshida ...................... | 438/167 |
| 5,939,737 A | | 8/1999 | Hirano ....................... | 257/194 |
| 5,970,328 A | * | 10/1999 | Park et al. .................. | 438/176 |
| 6,037,245 A | * | 3/2000 | Matsuda ..................... | 438/586 |
| 6,051,454 A | * | 4/2000 | Anda et al. ................. | 438/167 |
| 6,051,484 A | | 4/2000 | Morizuka ................... | 438/574 |
| 6,180,528 B1 | | 1/2001 | Sasaki et al. ............... | 438/704 |
| 6,387,783 B1 | * | 5/2002 | Furukawa et al. .......... | 438/574 |
| 6,392,278 B1 | | 5/2002 | Kimura ....................... | 257/401 |

* cited by examiner

FOREIGN PATENT DOCUMENTS

JP        02142143 A    5/1990

*Primary Examiner*—Michael Lebentritt
*Assistant Examiner*—Ron Pompey
(74) *Attorney, Agent, or Firm*—Westerman, Hattori, Daniels & Adrian, LLP.

(57) ABSTRACT

A semiconductor device has: a semiconductor substrate having a pair of current input/output regions via which current flows; an insulating film formed on the semiconductor substrate and having a gate electrode opening; and a mushroom gate electrode structure formed on the semiconductor substrate via the gate electrode opening, the mushroom gate electrode structure having a stem and a head formed on the stem, the stem having a limited size on the semiconductor substrate along a current direction and having a forward taper shape upwardly and monotonically increasing the size along the current direction, the head having a size expanded stepwise along the current direction, and the stem contacting the semiconductor substrate in the gate electrode opening and riding the insulating film near at a position of at least one of opposite ends of the stem along the current direction.

16 Claims, 11 Drawing Sheets

SEMICONDUCTOR DEVICE WITH MUSHROOM ELECTRODE AND MANUFACTURE METHOD THEREOF

CROSS REFERENCE TO RELATED APPLICATIONS

This application is a Divisional or prior application Ser. No. 10/084, 924 filed Mar. 1, 2002 now U.S. Pat. No. 6,717,271 which is based on Japanese patent applications No. 2001-236301, filed on Aug. 3, 2001, and No. 2002-019361, filed on Jan. 29, 2002, the whole contents of which are incorporated herein by reference.

BACKGROUND OF THE INVENTION

A) Field of the Invention

The present invention relates to a semiconductor device and its manufacture method, and more particularly to a semiconductor device having a so-called mushroom electrode and its manufacture method.

B) Description of the Related Art

The operation speed of a field effect transistor depends upon the gate length along the current path direction. In order to speed up a field effect transistor, it is desired to shorten the gate length. If the resistance of the gate electrode increases, a high speed operation of the transistor is restrained. In order to lower the gate electrode resistance, it is desired to set the cross sectional area of the gate electrode to a predetermined value or larger.

These requirements can be met by a mushroom type gate electrode which has a limited size of a lower part and a magnified size of the upper part. A generally upright lower part of the mushroom electrode is called a stem and the upper part with the magnified cross sectional area is called a head. A mushroom gate electrode is formed by vapor-depositing a gate electrode layer on a photoresist layer having a lower opening with vertical side walls and an upper expanded opening, and lifting off the resist layer.

As the aspect ratio of a vertical opening to be formed in a resist layer becomes large, it becomes difficult to uniformly bury the lower vertical opening with a gate electrode layer. In order to mitigate this difficulty, it has been proposed to form an upwardly broadening lower opening of a forward taper shape in a resist layer, and vacuum-deposit an upwardly broadening gate electrode stem of a forward taper shape without forming any void.

In forming an upward broadening gate electrode stem of a forward taper shape, it is important to reliably control a gate length and a contact cross section between semiconductor and the gate electrode in order to improve the performance and reliability of the device. A conventional tapering method is, however, insufficient in that a uniform opening shape and a gate electrode cross-sectional shape at the contact area between semiconductor and the gate electrode cannot be formed reliably.

If a field effect transistor to be formed has a gate length longer than 0.15 μm, a mushroom gate electrode can be formed without any problem by forming a lower opening with generally vertical side walls in a photoresist layer. If a device having a gate length equal to or shorter than 0.15 μm is formed by a conventional method, a manufacture yield of gate electrodes lowers.

It is desired to form an upwardly broadening resist opening of a forward taper shape for forming the stem of the gate electrode.

In forming an upwardly broadening gate electrode of a forward taper shape by a conventional method, a gate electrode stem opening is formed in a resist layer and is forwardly tapered by utilizing glass transition. This conventional method has, however, poor controllability so that a uniform gate length is difficult to be set. Because of poor controllability, the cross section at the contact between semiconductor and the gate electrode is difficult to be controlled and an operation speed and reliability of devices cannot be improved.

A fine gate opening for a conventional mushroom gate having a high aspect ratio is upwardly broadened by utilizing resist glass transition. This method has, however, poor controllability and is difficult to obtain a uniform opening length, i.e., gate length. Because of poor controllability, it is difficult to control the cross section of the contact area between semiconductor and the gate electrode and improve the operation speed and reliability of devices.

SUMMARY OF THE INVENTION

It is an object of the present invention to provide a semiconductor device having a fine gate capable of being manufactured with a high yield.

It is another object of the invention to provide a method of highly reliably manufacturing a semiconductor device with a fine gate.

It is another object of the invention to provide a semiconductor device having electrodes with various characteristics, the electrodes being made of the same layer.

It is another object of the invention to provide a semiconductor device manufacture method capable of forming electrodes with various characteristics by the same process.

According to one aspect of the present invention, there is provided a semiconductor device comprising: a semiconductor substrate having a pair of current input/output regions via which current flows; a first insulating film formed on the semiconductor substrate and having a gate electrode opening; and a mushroom gate electrode structure formed on the semiconductor substrate via the gate electrode opening, the mushroom gate electrode structure having a stem and a head formed on the stem, the stem having a limited size on the semiconductor substrate along a current direction and having a forward taper shape upwardly and monotonically increasing the size along the current direction, the head having a size expanded stepwise along the current direction, and the stem contacting the semiconductor substrate in the gate electrode opening and riding the first insulating film near at a position of at least one of opposite ends of the stem along the current direction.

According to another aspect of the present invention, there is provided a method of manufacturing a semiconductor device, comprising the steps of: (a) preparing a semiconductor substrate having a pair of current input/output regions; (b) forming an insulating layer on the semiconductor substrate; (c) forming a resist laminate on the insulating layer; (d) forming an upper opening through an upper region of the resist laminate, the upper opening having a laterally broadened middle space; (e) forming a lower opening through a lower region of the resist laminate, the lower opening communicating the upper opening, having a limited size along a current direction, and having generally vertical side walls; (e) etching the insulating film exposed in the lower opening; (g) performing a heat treatment of the resist laminate to deform the side walls of the lower opening so that at least one of opposite ends of the lower opening is retracted or retarded from a corresponding end of the insulating layer and that the lower opening has a forward taper shape upwardly and monotonically increasing a size of the lower opening along the current direction; and (h) filling a gate electrode stem in the lower opening and forming a head in the upper opening, the head having an expanded size along the current direction.

According to another aspect of the present invention, there is provided a semiconductor device comprising: a semiconductor substrate having a plurality of transistor regions; and a plurality of mushroom gate electrode structures formed on the semiconductor substrate in the plurality of transistor regions, the mushroom gate electrode structure having a stem and a head formed on the stem, the stem having a limited size on the semiconductor substrate along a current direction, and the head having a size expanded stepwise along the current direction, wherein at least some of the mushroom gate electrode structures have each a taper shape upwardly and monotonically increasing a size along the current direction, and the taper shapes have different angles in different transistor regions.

According to another aspect of the present invention, there is provided a method of manufacturing a semiconductor device, comprising the steps of (a) preparing a semiconductor substrate having a plurality of element regions; (b) forming a resist laminate on the semiconductor substrate; (c) applying an energy beam to an upper region of said resist laminate for defining an upper opening in each of said plurality of element regions, and applying an energy beam to a lower region of said resist laminate in at least part of said plurality of element regions at a dose depending on the element region; (d) forming the upper opening through the upper region of the resist laminate in each of the plurality of element regions, the upper opening having a laterally broadened middle space; (e) forming a lower opening through the lower region of the resist laminate in each of the element regions, the lower opening communicating the upper opening, having a limited size along a first direction, and having generally vertical side walls; (f) performing a heat treatment of the resist laminate to deform the side walls of the lower opening in at least some of the element regions in accordance with doses so that the lower opening has a taper shape upwardly and monotonically increasing a size of the lower opening along the first direction; and (g) filling a conductive stem in the lower opening and forming a head in the upper opening, the head having an expanded size along the first direction.

According to another aspect of the present invention, there is provided a method of manufacturing a semiconductor device, comprising the steps of: (a) preparing a semiconductor substrate having a plurality of element regions; (b) forming a resist laminate on the semiconductor substrate; (c) forming an upper opening through an upper region of the resist laminate in each of the plurality of element regions, the upper opening having a laterally broadening middle space; (d) applying an energy beam to a lower region of the resist lamination layer in at least some of the element regions at a dose corresponding to each element region; (e) forming a lower opening through the lower region of the resist laminate in each of the element regions, the lower opening communicating the upper opening, having a limited size along a first direction, and having generally vertical side walls; (f) performing a heat treatment of the resist laminate to deform the side walls of the lower opening in at least some of the element regions in accordance with doses so that the lower opening has a taper shape upwardly and monotonically increasing a size of the lower opening along the first direction; and (g) filling a conductive stem in the lower opening and forming a head in the upper opening, the head having an expanded size along the first direction.

As above, a semiconductor device having mushroom gate electrodes can be manufactured highly reliably. Even if the gate length is short, a mushroom gate electrode can be formed with a high yield.

If an insulating film is used as the lowest layer of a gate electrode structure, the semiconductor surface and metal gate electrode can be separated by the insulating film and direct contact therebetween can be prevented.

DESCRIPTION OF THE PREFERRED EMBODIMENTS

Prior to describing the embodiments of the invention, the study results made by the inventors will be described.

In order to form a fine mushroom gate electrode, it is desired to form an opening of an upwardly broadened taper shape in a resist layer. As resist capable of forming such an opening, polymethylmethacrylate (PMMA) is used by way of example.

Figures 6A, 6B:
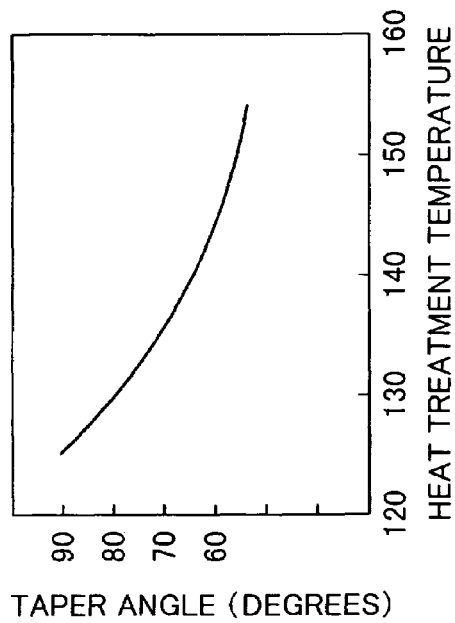
FIGS. 6A to 6E are cross sectional views of resist layers and graphs illustrating the study results made by the present inventors.

As shown in FIG. 6A, on the surface of a semiconductor substrate 50, a resist layer 51 of PMMA is formed to a desired thickness by spin coating. Baking is performed at a temperature near the boiling point of resist solvent to evaporate the solvent. The resist layer 51 after baking is subjected to electron beam (EB) drawing and developed to form an opening 52 having generally vertical side walls.

As shown in FIG. 6B, as the developed resist layer 51 is subjected to heat treatment, the side wall of the opening 52 changes to have an upwardly broadening forward taper shape. A forward taper opening 52x is therefore obtained.

For example, if the boiling point of PMMA solvent is about 140° C., baking is preformed at 145° C. after resist coating and before exposure, and heat treatment is performed at 135° C. after development. In this case, a forward taper angle θ of about 70 degrees can be formed. As shown in FIG. 6A, the forward taper angle is an angle less than 90 degrees between the opening side wall and the substrate surface.

Figure 6C:
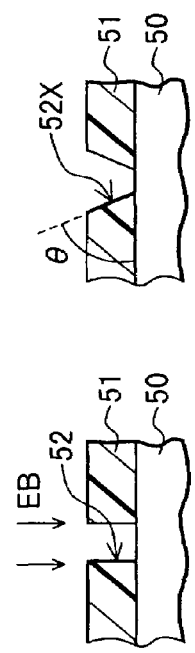

During the forward taper process of the resist opening, the upper part of the opening is expanded and the size of the opening at the bottom changes. This size change (at the bottom) is dependent upon the heat treatment temperature. FIG. 6C is a graph showing an opening length change with a heat treatment temperature after development. The abscissa represents a heat treatment temperature in the unit of ° C., and the ordinate represents a ratio of a change in the opening length to the opening length before heat treatment. Although the opening length becomes longer at low heat treatment temperatures, it becomes shorter at higher heat treatment temperatures. In other words, an opening having a length either longer or shorter than the original length can be formed.

Figure 6D:
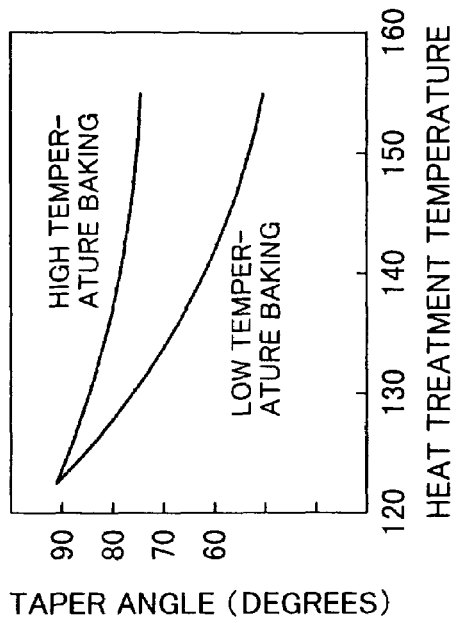

The graph of FIG. 6D shows a change in the taper angle with a heat treatment temperature after development. The abscissa represents a heat treatment temperature in the unit of ° C., and the ordinate represents a taper angle in the unit of degree. At a low heat treatment temperature, the taper angle is nearly 90 degrees and the effects of the forward taper process are not obtained. As the heat treatment temperature rises, the taper angle becomes small and the considerable effects of the forward taper process can be obtained. For example, in order to obtain a forward taper angle of about 75 degrees, heat treatment is performed at about 133° C.

The characteristics shown in FIGS. 6C and 6D are obtained by setting a constant temperature of baking after resist coating and before exposure. If the baking temperature is changed, the characteristics shown in FIGS. 6C and 6D are changed. Generally, as the baking is performed at a higher temperature, the effects of the forward taper process obtained at the later heat treatment are small. It can be considered that at a higher baking temperature, bridging of resist molecules is enhanced so that deformation of the resist becomes difficult at the later heat treatment. In a practical case, in order to form an opening of 0.1 µm in length, it is desired to use a taper angle of 80 degrees or smaller so that the process yield can be maintained high.

Figure 6E:
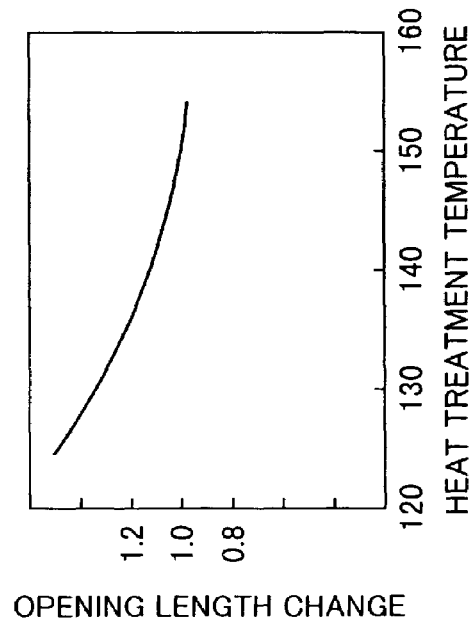

FIG. 6E is a graph showing a difference of the forward tapering effect between relatively low and high temperatures of pre-baking after resist coating and before exposure. The abscissa represents a heat treatment temperature in the unit of ° C., and the ordinate represents a taper angle in the unit of degrees. As the pre-baking is performed at a high temperature, the effects of the forward taper process obtained by heat treatment after development become small. As the pre-baking is performed at a lower temperature, the effects of the forward taper process obtained by heat treatment after development become larger.

It can be understood from these characteristics that a desired opening length change and a desired taper angle can be obtained by selecting a pre-baking temperature after resist coating and before exposure and a heat treatment temperature after development.

Generally, a resist opening for a fine gate electrode is formed by EB exposure. When EB exposure is also carried out on the region adjacent to the gate opening at such a dose level that the resist will not be developed, high forward tapering effect can be obtained at a lower heat treatment temperature. This can be ascribed to a smaller molecular weight of resist whose bonds are broken upon application of an energy beam such as an electron beam.

Figure 7:
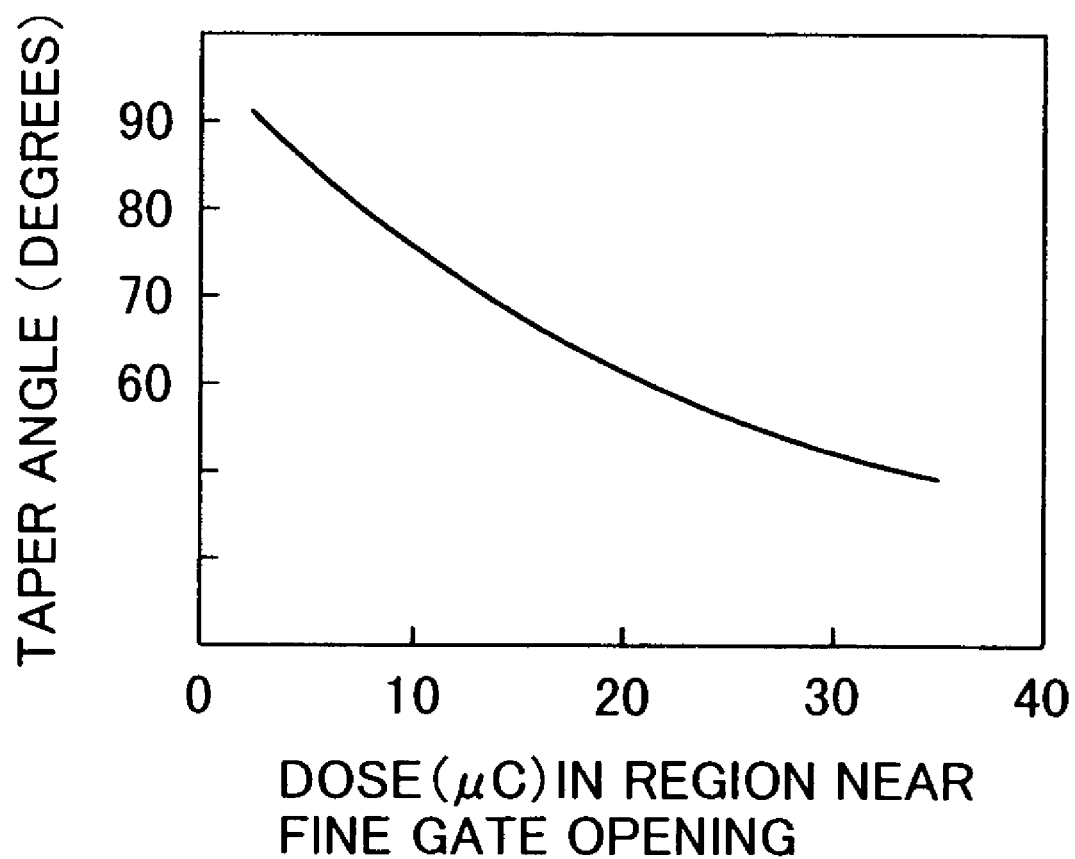
FIG. 7 is a graph showing a dose dependency upon a forward taper angle illustrating the study results made by the present inventors.

FIG. 7 is a graph showing a change in the taper angle obtained when auxiliary EB radiation is performed for a region near the fine gate opening. The abscissa represents a dose in the region near a fine gate opening in the unit of µC, and the ordinate represents a taper angle in the unit of degree. As the dose is increased, the taper angle becomes smaller at the same heat treatment temperature and the large forward tapering effect can be obtained. Since EB exposure can be selectively performed in a desired region, a desired region near the gate opening subjected to EB exposure can be changed to have a forward taper angle.

PMMA resist can be coated repetitively to form two or more PMMA resist layers each of which can be baked at different temperature. If a lower level layer is baked at a high temperature and a higher level layer is baked at a low temperature, the effects of the high temperature baking are given only to the lower level layer. Therefore, the lower level layer is difficult to have a large forward taper angle, whereas the upper level layer is likely to have a larger forward taper angle because the upper level layer was subjected only to the low temperature baking. If the upper level layers of the laminated resist layers are baked at lower temperatures, the taper process effects become large at the upper level layers.

Embodiments of the invention will be described in connection with the above-described study results.

FIGS. 1A to 1J are cross sectional views of a semiconductor substrate illustrating the manufacture processes for a semiconductor device according to a first embodiment of the invention. FIGS. 2A to 2D are cross sectional views of the semiconductor substrate illustrating the characteristics of the embodiment shown in FIGS. 1A to 1J.

Figure 1A:
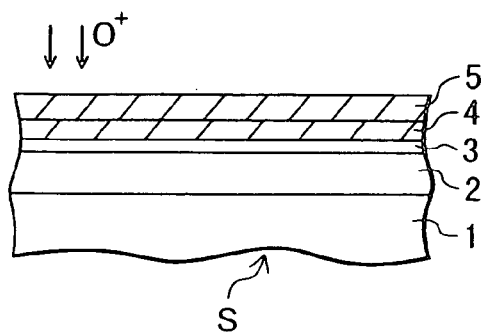
FIGS. 1A to 1J are cross sectional views of a semiconductor substrate illustrating a method of manufacturing a semiconductor device according to an embodiment of the invention.

As shown in FIG. 1A, for example, on the surface of a GaAs substrate 1, a GaAs buffer layer 2 is grown to a thickness sufficient for relaxing the influence of dislocation of the substrate, by a growth method such as metal organic chemical vapor deposition (MOCVD) and molecular beam epitaxy (MBE). On this GaAs buffer layer 2, an electron transit layer 3 of InGaAs is grown to a thickness of, for example, 14 nm. On the electron transit layer 3, an electron supply layer 4 of AlGaAs is grown to a thickness of about 25 nm. On the electron supply layer 4, a low resistance layer 5 of GaAs doped with Si is grown to a thickness of about 50 nm. A semiconductor substrate S is therefore formed on which a semiconductor device is formed.

In order to define element regions in a conductive semiconductor substrate surface layer, semi-insulating regions are formed by implanting elements such as oxygen into regions other than active regions and inactivating donors in the ion implanted regions.

Figure 1B:
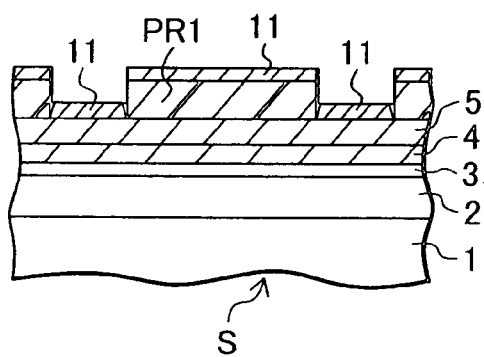

As shown in FIG. 1B, a resist layer PR1 is coated on the surface of the semiconductor substrate S, exposed and developed to form openings for ohmic electrodes. After a resist pattern PR1 with the ohmic electrode openings is formed, an ohmic electrode layer 11 is formed in a high vacuum vapor deposition system, the ohmic electrode layer 11 having a lamination structure of an AuGe layer of about 20 nm in thickness and an Au layer of about 300 nm in thickness. As the resist pattern PR1 is removed, the ohmic electrode layer deposited on the resist pattern PR1 is also lifted off and removed. Ohmic electrodes 11 are therefore left on the semiconductor substrate S.

Figure 1C:
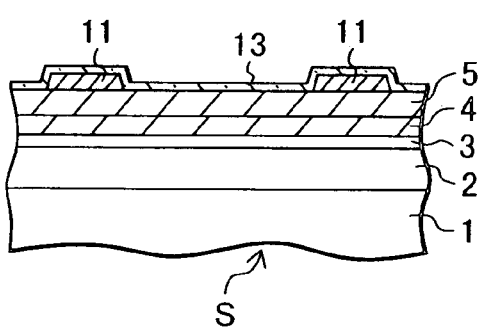

As shown in FIG. 1C, an SiN film 13 of about 20 nm in thickness is formed on the semiconductor substrate S, covering the ohmic electrodes 11. This SiN film 13 improves tight contactness between the substrate and a resist layer to be formed over the substrate.

Figure 1D:
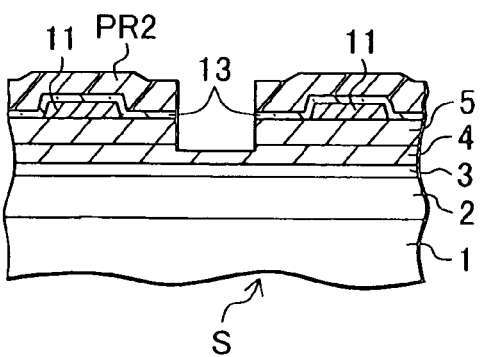

As shown in FIG. 1D, a resist layer PR2 is coated on the SiN film 13, and an opening for a gate recess region is formed through the resist layer PR2 by EB drawing. The gate recess region is, for example, a gate area added with an area of about 0.1 μm along the gate length direction on both sides of the gate area.

After the resist pattern PR2 with the gate recess region opening is formed, by using this resist pattern as a mask, the SiN film 13 is etched by dry etching using $SF_6$ gas and then the low resistance GaAs layer 5 is etched by dry etching using $SiCl_4$ gas. The electron supply layer 6 is therefore exposed in the gate recess region. The resist pattern PR2 is thereafter removed.

Figure 1E:
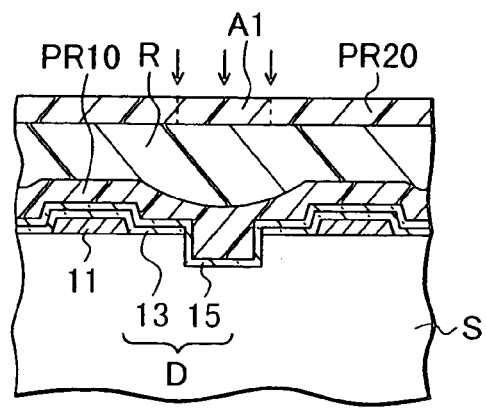

As shown in FIG. 1E, after the gate recess region is etched, an SiN film 15 having a thickness of about 20 nm is deposited on the substrate surface to protect the uppermost surface and improve tight contactness with a resist layer to be next formed. On the SiN film 15, a PMMA positive type electron beam resist layer PR10 is spin-coated on the SiN film 15 to a thickness of about 300 nm and is subjected to a heat treatment for 10 minutes at 160° C. On this electron beam resist layer PR10, an alkali-soluble resist layer R is spin-coated to a thickness of about 600 nm, and baked for 4 minutes at 160° C. On this alkali-soluble resist layer R, a polystyrene electron beam resist layer PR20 is spin-coated to a thickness of about 200 nm, and baked for about 4 minutes at 160° C.

EB drawing is performed for the electron beam resist layer PR20 to define an opening A1 having a width of about 0.8 μm.

Figure 1F:
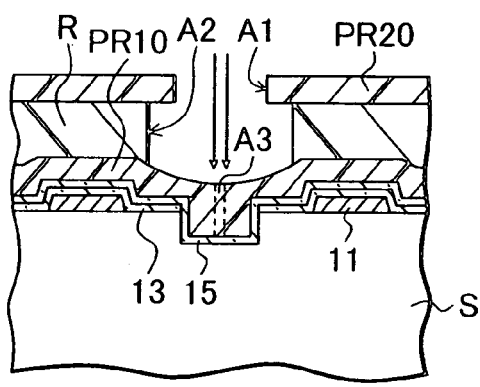

As shown in FIG. 1F, the exposed region A1 of the electron beam resist layer PR20 is developed by mixed solution of methylisobutylketone (MIBK) and methylethylketone (MEK). By using the developed electron beam resist layer PR20 as a mask, the underlying resist layer R is etched by alkaline developing liquid. With this etching, an opening is formed through the resist layer R, the opening being retracted by about 0.2 μm or laterally deeper from the opening of the electron beam resist layer PR20.

A gate electrode opening having a width of about 0.1 μm is defined by EB drawing through the electron beam resist layer PR10 exposed in the opening. An EB exposed region A3 is developed by mixed solution of MIBK and isopropyl alcohol (IPA) to form a gate electrode opening through the electron beam resist layer PR10.

Figure 1G:
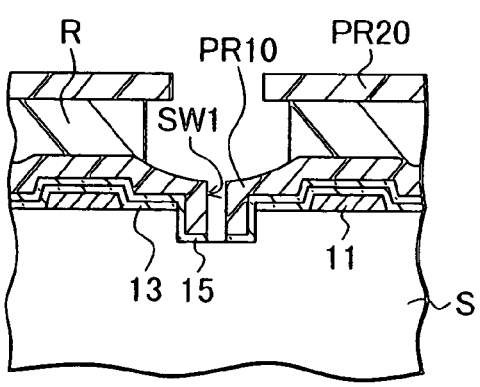

As shown in FIG. 1G, by using the electron beam resist layer PR10 as a mask, the exposed SiN film 15 is etched by dry etching using $SF_6$ gas. A substrate surface having a width of about 0.1 μm is therefore exposed in the gate electrode opening having generally vertical side walls SW1.

Figure 1H:
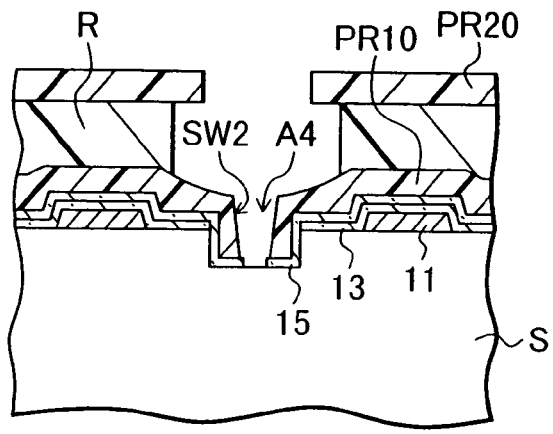

As shown in FIG. 1H, a heat treatment is performed for about 10 minutes at a temperature which forms a forward taper and elongates the opening length, for example, at 130° C. With this heat treatment, while the opening length becomes longer, the forward taper upward broadening the opening is formed. A gate electrode opening A4 having slanted side walls SW2 is therefore formed in the gate electrode opening. The side walls SW2 of the electron beam resist layer have the shape retracting from the edges of the underlying SiN film 15, for example, by 0.01 μm.

Figure 1I:
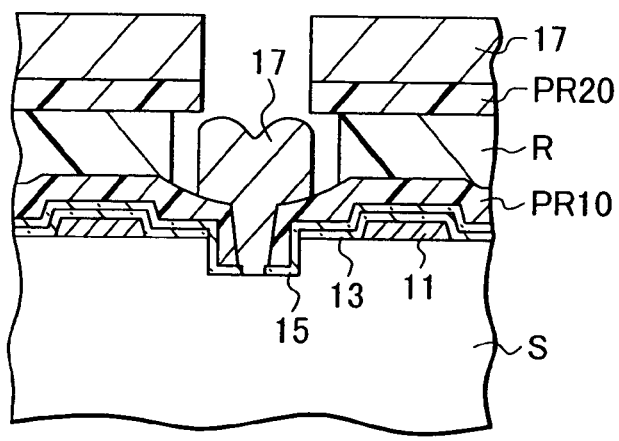

As shown in FIG. 1I, an insulating metal oxide film, e.g., $TiO_x$, is deposited in a high vacuum vapor deposition system from the upper side of the semiconductor substrate S subjected to the forward taper process. Then, a Ti layer, a Pt layer and an Au layer are laminated to form a gate electrode layer 17.

The function of the forward taper process for a gate electrode opening before the gate electrode layer depositing step will be described.

Figure 2A:
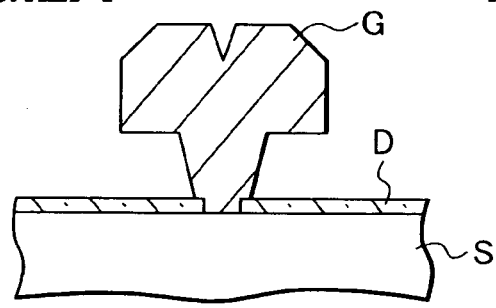
FIGS. 2A to 2D are cross sectional views of the semiconductor device illustrating characteristic points of the embodiment shown in FIGS. 1A to 1J.
Figure 2B:
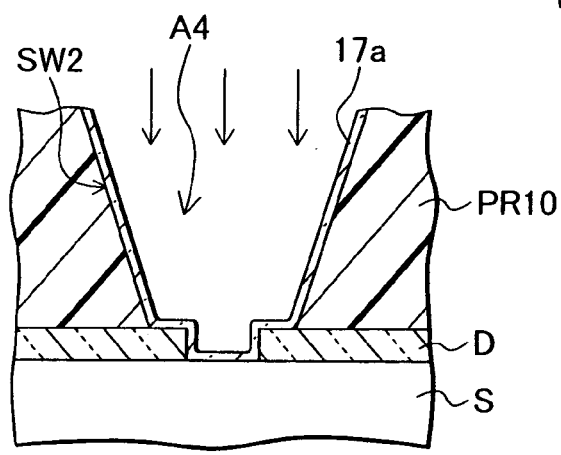
Figure 2C:
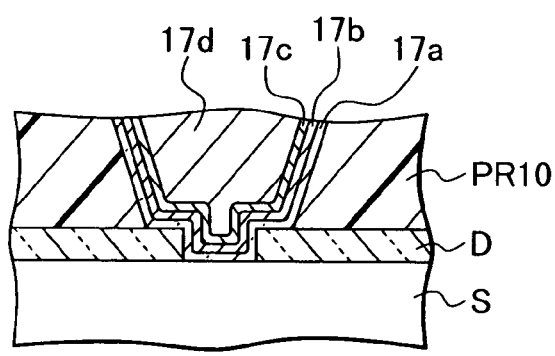
Figure 2D:
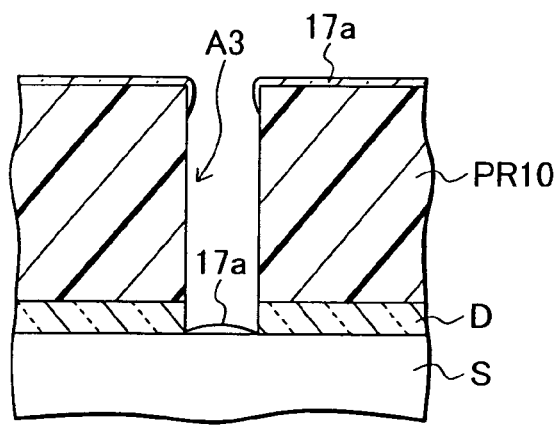

As shown in FIG. 2D, if the resist layer PR10 has vertical side walls, although a vapor deposition layer 17a vapor-deposited from the upper side of the substrate S can be reliably deposited in the central area of the opening bottom, it becomes difficult to be deposited in the peripheral area of the opening bottom because of the shading influences of the side walls of the resist layer PR10. The vapor deposition layer becomes thin in the peripheral area of the opening bottom and in some cases, the surface of the substrate S is exposed in this area. If the $TiO_x$ is formed in this state and a Ti layer is vapor-deposited thereon, the Ti layer may directly contact the substrate S surface in the peripheral area of the opening bottom. As Ti contacts the semiconductor surface, Ti and semiconductor chemically react under the condition that an energy such as an electric field is applied, and the desired device characteristics cannot be obtained. This phenomenon is likely to occur on the drain side to which a strong electric field is applied.

As shown in FIG. 2B, although a insulating layer D (SiN layer 15) on the semiconductor substrate S has generally vertical side walls, the height of the side wall is very low. The electron beam resist layer PR10 on the insulating layer D has a forward taper upward extending the width of the opening. A vapor deposition 10 layer deposited from the upper side is not obstructed by the side walls of the resist layer PR10, and can be generally uniformly deposited in the opening of the insulating layer D. The $TiO_x$ layer 17a first deposited reliably covers the exposed substrate S surface to prevent a metal layer to be later deposited from contacting the semiconductor layer.

As shown in FIG. 2C, in the gate electrode opening defined by the insulating layer D and electron beam resist layer PR10, a $TiO_x$ 17a having a thickness of, for example, several nm, a Ti layer 17b having a thickness of, for example, 10 nm, and a Pt layer 17c having a thickness of, for example, 10 nm are sequentially formed. Thereafter, an Au layer 17d having a sufficient thickness of, for example, about 500 nm is deposited.

As shown in FIG. 1I, in the opening defined by the laminated resist structure, a mushroom gate electrode 17 is therefore formed.

Figure 1J:
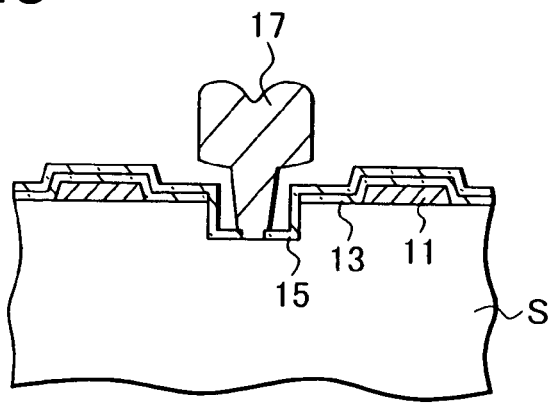

As shown in FIG. 1J, the semiconductor substrate is immersed into heated organic solution to dissolve the laminated resist layers to lift off the gate electrode layer 17 deposited on the resist lamination structure. A mushroom gate electrode 17 is therefore left on the semiconductor substrate S.

As shown in FIG. 2A, the mushroom gate electrode obtained has the structure that the opposite ends of the gate electrode ride the insulating film D. As shown in FIG. 2C, the surface of the semiconductor substrate S exposed in the opening of the insulating film D is securely covered with the $TiO_x$ film. The semiconductor layer S and a metal layer such as a reactive Ti layer formed on the $TiO_x$ layer 17a can be prevented from direct contact.

The gate electrode riding the insulating film D extends outward from the gate electrode in contact with the semiconductor layer. An electric field near the opposite ends of the gate electrode can be relaxed.

With the gate electrode structure of the embodiment, the effective gate electrode length is determined by the opening length defined the insulating film D. The gate electrode G has a stem broader than the opening length of the insulating film D and rides the insulating film D. For example, even if an electrode having a gate length of 0.1 µm rides the insulating film D by 0.01 µm, generally the same electric characteristics of the gate electrode structure can be retained. Since the contact area of the gate electrode increases and the gate electrode covers the steps, the mechanical stability of the gate electrode can be improved.

FIGS. 3A to 3D are cross sectional views of a semiconductor substrate illustrating the semiconductor device manufacture method according to another embodiment of the invention.

In the processes shown in FIGS. 1A to 1G, the process of depositing the SiN layer 15 after the gate recess region is formed is omitted, and the other processes are performed in similar manners.

Figure 3A:
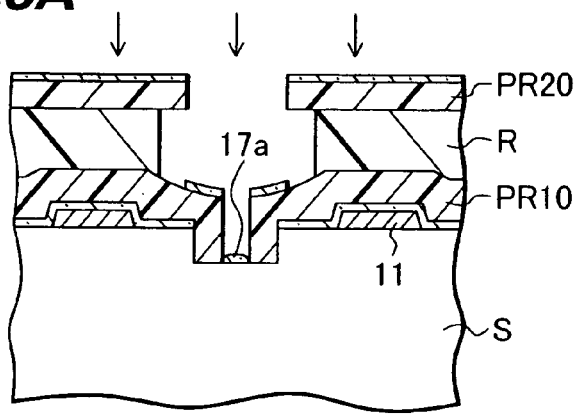
FIGS. 3A to 3D are cross sectional views of a semiconductor substrate illustrating a method of manufacturing a semiconductor device according to another embodiment of the invention.

As shown in FIG. 3A, an opening is defined by the laminated resist layers in the gate recess region where the semiconductor substrate S is exposed. A $TiO_x$ layer 17a is vapor-deposited from the upper side of this structure. On the bottom of the gate electrode opening having generally vertical side walls, the $TiO_x$ layer 17a is therefore deposited.

Figure 3D:
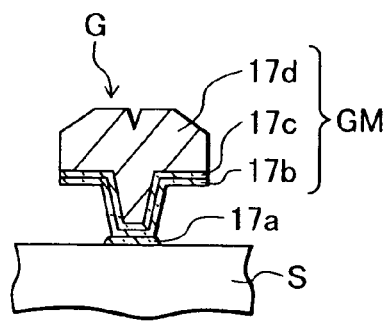
Figure 3B:
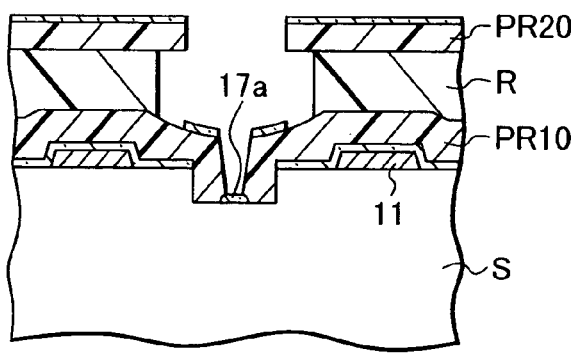

As shown in FIG. 3B, a heat treatment is performed, for example, for 10 minutes at 145° C. under the conditions that the gate electrode opening has a forward taper and the opening length is shortened. The gate electrode opening has a forward taper shape upward broadening its opening, the opening length at the bottom of the opening is shortened, and the resist layer PR10 rides the deposited $TiO_x$ layer 17a.

Figure 3C:
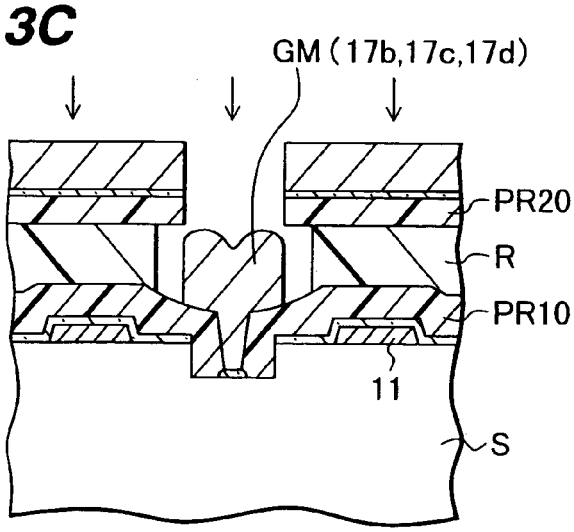

As shown in FIG. 3C, a Ti layer, a Pt layer and an Au layer are sequentially deposited in a high vacuum state to form a gate metal layer GM.

As shown in FIG. 3D, the semiconductor substrate is immersed into heated organic solution to leave a gate electrode G through lift-off.

With the gate electrode structure of the embodiment, the metal gate electrode structure GM is formed inside the surface area of the insulating metal oxide film 17a on the semiconductor substrate. Since the opposite ends of the metal gate electrode structure GM are positioned inside the surface area of the insulating metal oxide film 17a, it is possible to prevent a direct contact between reactive metal and the semiconductor surface.

Next, another embodiment will be described in which an additional dose is used to enhance the forward taper process.

FIG. 7 is a graph showing a taper angle dependency upon a dose obtained by experiments made by the present inventors. If an electron beam having an energy equal to or larger than a threshold value is applied to an EB exposure resist, the molecular weight of the resist lowers so that the resist can be developed by resist developer liquid. If the radiation amount of an electron beam is lowered to a proper value, the state that resist has a smaller molecular weight can be realized although the resist is not developed. If such a resist layer is subjected to a heat treatment, the resist layer can have an upward broadening taper shape at a lower temperature than an electron beam is not applied.

In FIG. 7, the abscissa represents a dose of an electron beam applied to a region near the fine gate, and the ordinate represents a taper angle. The heat treatment temperature is set to such a value that a taper shape is hardly obtained if an electron beam was not applied. As the dose increases, the taper angle relative to the substrate surface becomes small starting from 90 degrees. Namely, the opening side walls broaden and the taper degree becomes large.

Figure 4A:
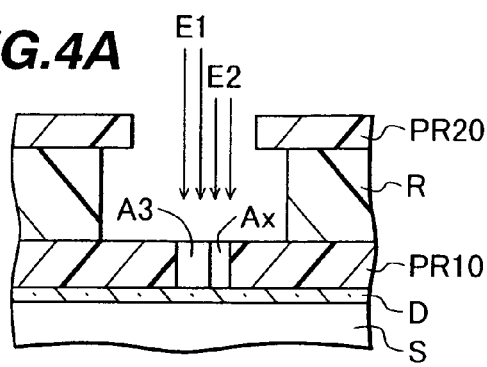
FIGS. 4A to 4E are cross sectional views of a semiconductor substrate illustrating a method of manufacturing a semiconductor device according to another embodiment of the invention.

As shown in FIG. 4A, a lamination structure of a insulating layer D, an electron beam resist layer PR10, a resist layer R, and an electron beam resist layer PR20 is formed on a semiconductor substrate S, in the manner similar to those processes shown in FIGS. 1A to 1J.

A gate electrode opening A3 is drawn by an electron beam E1 at a predetermined dose. For example, a gate electrode opening having a width of 0.1 µm is EB-drawn. An auxiliary EB radiation whose energy is set equal to or lower than a development limit, e.g., about a half of the threshold value, is applied to the region near the gate electrode opening, in the example shown in FIG. 4A, a right region having a width of about 0.05 µm. As shown in FIG. 4B, the electron beam resist layer PR10 is developed by mixed solution of MIBK and IPA. With this development, although the exposed region A3 for a gate electrode is removed, the auxiliary exposed region Ax is left. The insulating film D, e.g., an SiN film exposed on the bottom of the gate electrode opening is removed by dry etching using, for example, $SF_6$ gas.

In this embodiment, two types of electron beam radiation are sequentially performed and then the development is performed. Development may be performed after the electron beam radiation is performed, and then the auxiliary EB exposure is performed for the developed resist pattern. Also, EB exposures for the upper and lower apertures and for affording tapering can be performed through the upper resist layer at the same stage.

Figure 4D:
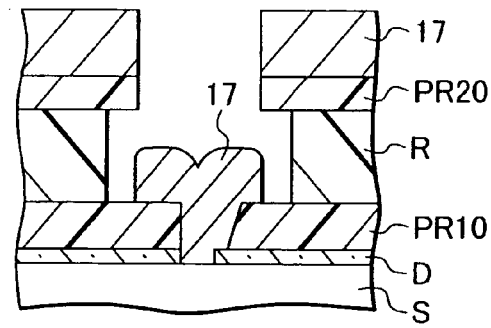
Figure 4B:
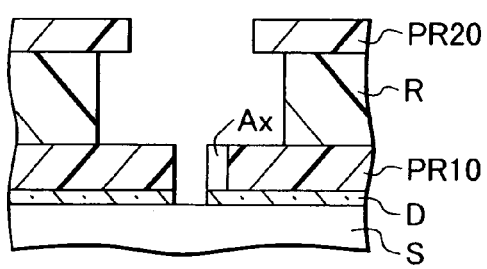
Figure 4E:
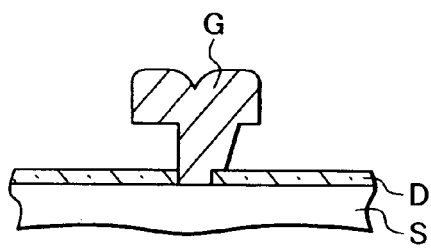
Figure 4C:
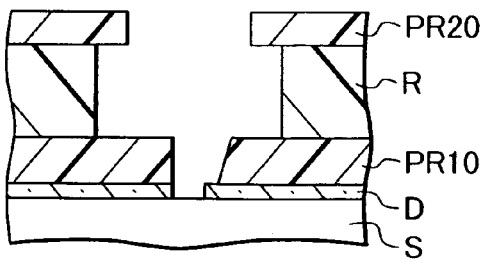

As shown in FIG. 4C, a forward taper heat treatment is performed for 10 minutes in a temperature range allowing the opening length to be elongated, e.g., at 130° C. The region, on the left side of the opening, of the electron beam resist layer PR10 auxiliary applied with an electron beam changes its shape to the taper shape with a priority over the other regions. The left side wall of the electron beam resist layer PR10 is maintained being relatively less influenced.

As shown in FIG. 4D, in a high vacuum vapor deposition system, an insulating metal oxide film ($TiO_x$ film), a Ti layer, a Pt layer and an Au layer are sequentially deposited in the opening to form a gate electrode 17.

As shown in FIG. 4E, the semiconductor substrate is immersed into heated organic solution to leave a gate electrode G through lift-off. With the gate electrode structure of the embodiment, the gate electrode G rides the insulating film D only on one side thereof, e.g., on the drain side. Since the gate electrode rides the insulating film D on the drain side, an electric field in a strong electric field intensity region where reaction is likely to progress can be relaxed. Since the insulating metal oxide film securely covers the semiconductor substrate S surface, a direct contact between reactive metal and the semiconductor substrate can be avoided.

Another embodiment will be described in which the forward taper shape is controlled by changing the baking temperature of a laminated resist layer structure.

Figure 5A:
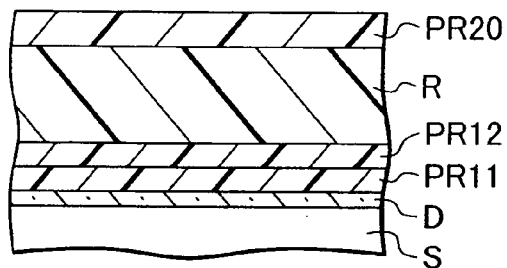
FIGS. 5A to 5E are cross sectional views of a semiconductor substrate illustrating a method of manufacturing a semiconductor device according to another embodiment of the invention.

As shown in FIG. 5A, a semiconductor substrate S is prepared by performing the processes similar to the first embodiment shown in FIGS. 1A to 1J before the gate recess region is formed. On the surface of the semiconductor substrate S, a insulating film D such as an SiN film is formed. Thereafter, a first electron beam resist layer PR11 is coated to a thickness of about 200 nm by using PMMA or the like, and baked, for example, for 5 minutes at 185° C. On the first electron beam resist, a second electron beam resist layer PR12 is coated to a thickness of about 200 nm by using PMMA or the like, and baked, for example, for 5 minutes at 145° C. The lower resist lamination is constituted of a lower layer baked at a high temperature and an upper layer baked at a low temperature.

On the second electron beam resist layer PR12, for example, an alkali-soluble resist layer R is coated to a thickness of about 600 nm, and baked for 4 minutes at 145° C. On the alkali-soluble resist layer R, a polystyrene electron beam resist layer PR20 as an upper electron beam resist layer is coated to a thickness of about 200 nm, and baked for about 4 minutes at 145° C.

Figure 5B:
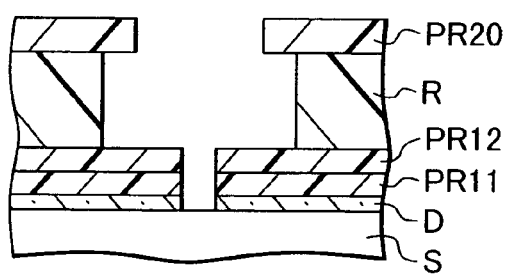

As shown in FIG. 5B, EB drawing is performed for the upper electron beam resist layer PR20 to define an opening Al having a width of about 0.8 μm, and the upper electron beam resist layer PR20 is developed by mixed solution of MIBK and MEK. By using the upper electron beam resist layer PR20 as a mask, the underlying resist layer R is etched by alkaline developing liquid. With this etching, an opening is formed through the resist layer R, the opening being retracted by about 0.2 μm or laterally deeper from the opening of the upper electron beam resist layer PR20.

An opening having a width of about 0.1 μm is defined by EB drawing through the laminated electron beam resist layers PR12 and PR11. The resist layers are then developed by mixed solution of MIBK and IPA. After the opening is formed through the electron beam resist layers, the exposed insulating film D is dry-etched by $SF_6$ or the like.

Figure 5C:
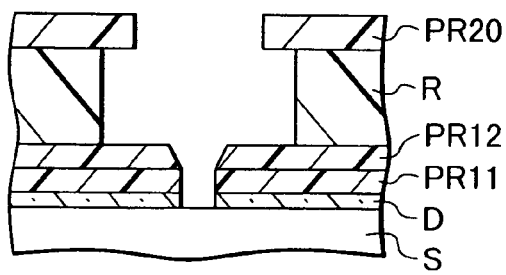

As shown in FIG. 5C, a heat treatment is performed for the lower laminated resist layers PR12 and PR11 for about 10 minutes at a temperature which forms a forward taper, for example, at 140° C. The first electron beam resist layer PR11 baked at a relatively high temperature has a low forward taper degree, whereas the second electron beam resist layer PR12 baked at a relatively low temperature has a large forward taper degree. In this manner, the forward taper broadening more at an upper position can be obtained.

Figure 5D:
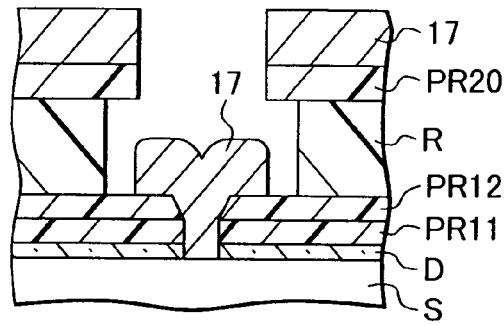

As shown in FIG. 5D, similar to the above-described embodiment, in a high vacuum vapor deposition system, an insulating metal oxide film ($TiO_x$ film), a Ti layer, a Pt layer and an Au layer are sequentially deposited in the opening to form a gate electrode structure 17.

Figure 5E:
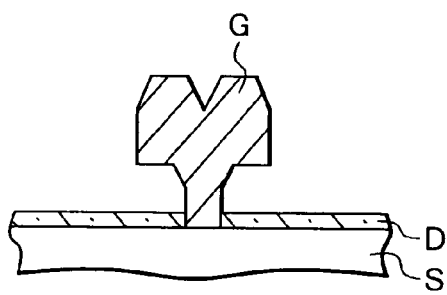

As shown in FIG. 5E, the semiconductor substrate is immersed into heated organic solution to leave a gate electrode G through lift-off.

With the gate electrode structure of the embodiment, the lower stem of the fine gate has relatively vertical side walls, and the upper stem has a forward taper upward broadening the opening. The insulating film D on the semiconductor surface may be omitted.

Various modifications of the embodiments are possible. For example, although the insulating oxide film is used as the lowest layer of the gate electrode structure, a gate electrode structure that a Schottky metal layer directly contacts the semiconductor surface may be formed. The cross section of a taper shape is not necessarily a straight line, but any other lines may be possible so long as they change monotonously. Although an SiN film is used as the insulating film, other insulating films may be used. Instead of an insulating metal oxide film, other insulating films may also be used. The composition of a gate electrode is not limited to those described earlier.

In the embodiments, an opening in a PMMA resist film is changed to have a forward taper shape. Instead, in manufacturing semiconductor devices, other resist layers may also be used whose opening shape can be adjusted with good controllability in a temperature range where an abrupt opening shape change to be caused by glass transition or the like does not occur (in a temperature range lower than a glass transition temperature).

In forming the recess region, other methods may be used. For example, a semiconductor layer may be wet-etched, an SiN film may not used, or a semiconductor layer may be etched by using an opening for a mushroom gate.

Figure 8:
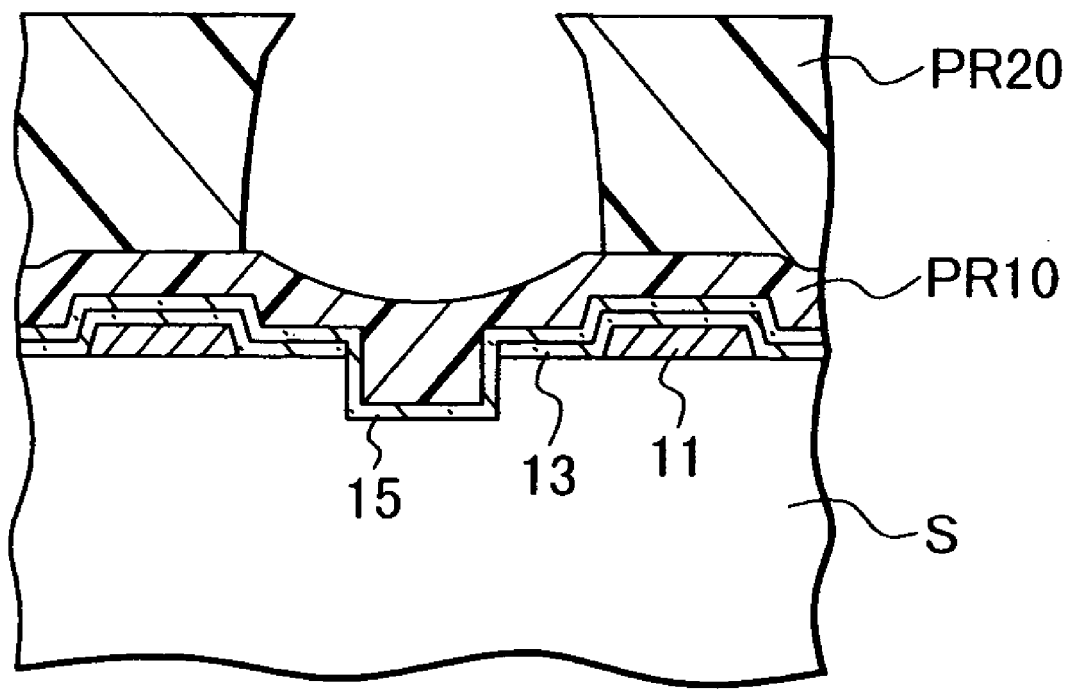
FIG. 8 is a cross sectional view of a semiconductor substrate illustrating a method of manufacturing a semiconductor device according to another embodiment of the invention.

In the embodiments, the head of a mushroom gate electrode is formed by using three electron beam resist layers. Instead, the head of a mushroom gate electrode may be formed by using a backward taper resist layer opening in a photoresist layer or the like. In FIG. 8, a resist layer PR20 is formed on an electron beam resist layer PR10, and the resist layer PR2 is formed with a backward taper opening downward broadening its opening. The other structures are similar to those shown in FIG. 1F. The head of a mushroom gate electrode may be formed through milling by using an inverted pattern.

Various semiconductor elements are formed in a semiconductor integrated circuit. A high speed operation is required for some transistors and not required for other transistors. It is preferable that the gate length of a transistor operating at high speed is short, and the gate length of a transistor operating at not so high speed is not so much required to be short.

FIGS. 9A to 9E are plan views and cross sectional views of a semiconductor device according to another embodiment of the invention.

Figure 9A:
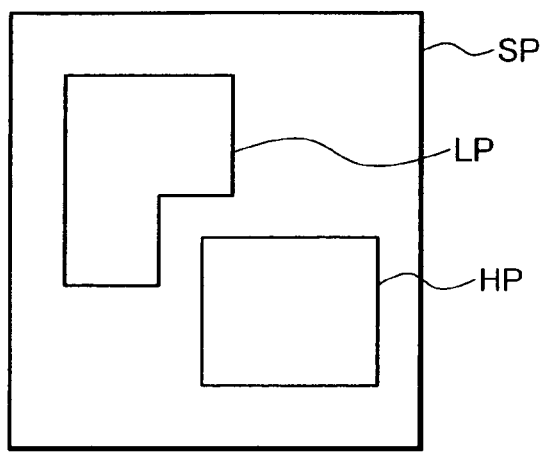
FIGS. 9A to 9E are plan views and cross sectional views illustrating another embodiment of the invention.

FIG. 9A is a schematic plan view showing the structure of a semiconductor integrated circuit device. On the surface of a semiconductor chip SP, a high speed circuit HP and a low speed circuit LP are formed.

Figure 9B:
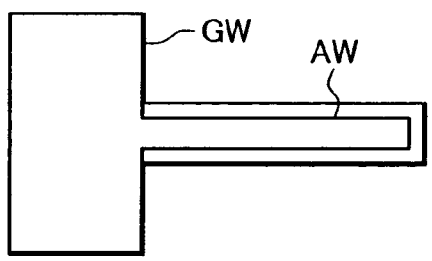

FIG. 9B is a schematic plan view showing gate resist openings for a transistor formed in the low speed circuit LP. An opening AW is a gate stem opening formed through the uppermost to lowermost surfaces of the laminated resist layers. An upper opening GW is an opening formed only through upper layers of the laminated resist layers.

Figure 9C:
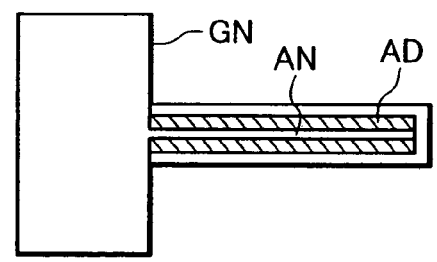

FIG. 9C is a schematic plan view showing gate resist openings for a transistor formed in the high speed circuit HP. An opening AN is a gate stem opening formed through the uppermost to lowermost surfaces of the laminated resist layers. An opening GN is an opening formed only through upper layers of the laminated resist layers. A region AD is a region where auxiliary EB exposure is performed. Although the resist layer is not developed by auxiliary EB exposure, the later heat treatment forms a forward taper shape upward broadening the opening.

Figure 9D:
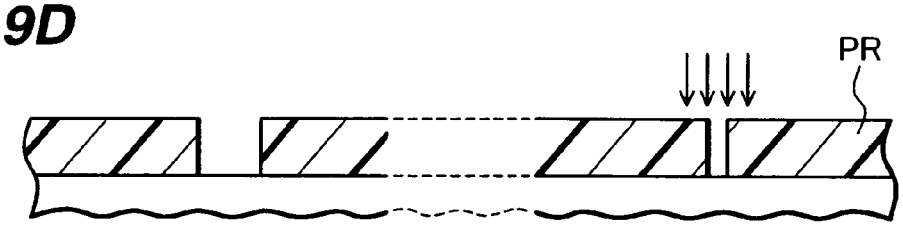

As shown in FIG. 9D, the auxiliary EB exposure is not performed for the low speed circuit, but it is performed only for the high speed circuit. For example, the auxiliary EB exposure is performed at an acceleration energy of 50 keV and a dose of 20 μC.

Thereafter, a heat treatment is performed, for example, for 5 minutes at 130° C. Since the average molecular weight of resist in a region subjected to the auxiliary EB exposure is low, this heat treatment forms a forward taper shape upward broadening its opening. The region not subjected to the auxiliary EB exposure has no significant forward taper shape. After the gate electrode is deposited, the resist layer is removed to lift off the gate electrode layer on the resist layer.

Figure 9E:
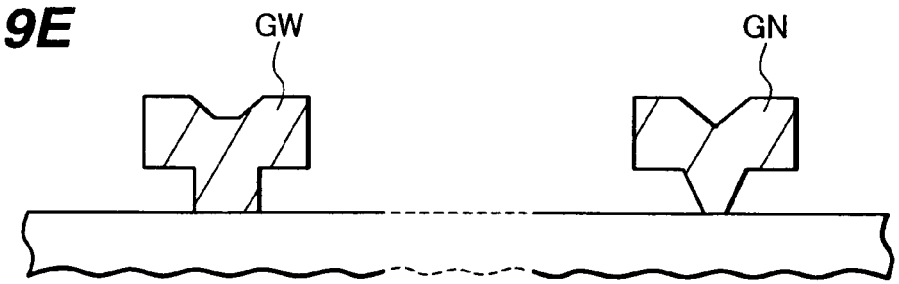

FIG. 9E shows the outline shapes of gate electrodes. The gate electrode GW in the low speed circuit has a relatively long gate length and its stem is defined by generally upright side walls. This gate electrode has a high mechanical strength. The gate electrode GN in the high speed circuit has a stem of a taper shape upward extending the size along the gate length direction, the gate length being defined at the bottom and being short. Such a gate electrode is suitable for a high speed operation.

A semiconductor integrated circuit is formed not only with transistors but also with other electronic components such as capacitors and wiring lines. A mushroom structure is also applied to circuit components other than transistors.

FIGS. 10A to 10D show the structure of a semiconductor device according to another embodiment of the invention.

Figure 10A:
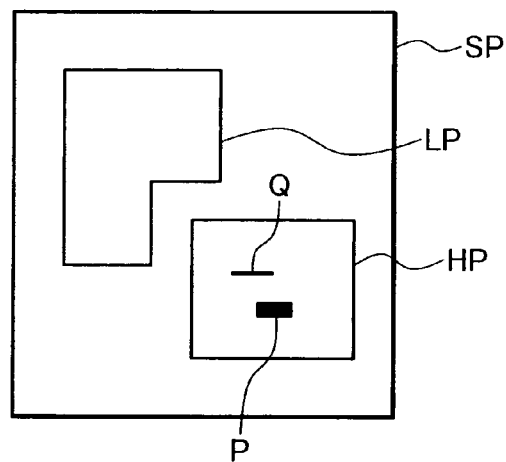
FIGS. 10A to 10D are plan views and cross sectional views illustrating another embodiment of the invention.

FIG. 10A is a schematic plan view showing the structure of a semiconductor chip SP. Similar to the structure shown in FIG. 9A, a high speed circuit area HP and a low speed circuit area LP are disposed in the semiconductor chip HP. In the high speed circuit area HP, a transistor Q operating at high speed and a circuit component P other than a transistor having a thick finger are disposed.

Figure 10B:
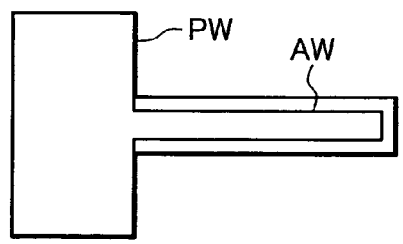

FIG. 10B is a schematic plan view showing resist openings for the circuit component P in the high speed circuit area.

Figure 10C:
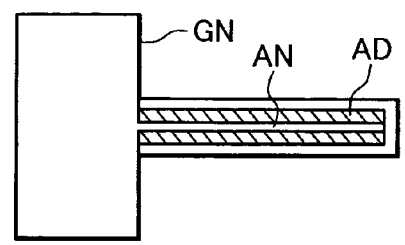

FIG. 10C is a schematic plan view showing gate resist openings for the transistor Q in the high speed circuit area. The shapes of these resist openings are similar to those shown in FIGS. 9B and 9C. The resist openings for the circuit component P have an opening PW formed through the upper resist layer and an opening formed through the upper and lower resist layers. The resist openings for the transistor Q in the high speed circuit area have an opening GN formed through the upper resist layer and an opening AN formed in correspondence with the gate electrode stem. Auxiliary EB exposure regions AD are defined on both sides of the opening AN.

Similar to the embodiment shown in FIGS. 9A to 9E, the EB exposure is performed for the regions AD, and thereafter the processes for heat treatment, electrode layer deposition and resist layer removal are executed.

Figure 10D:
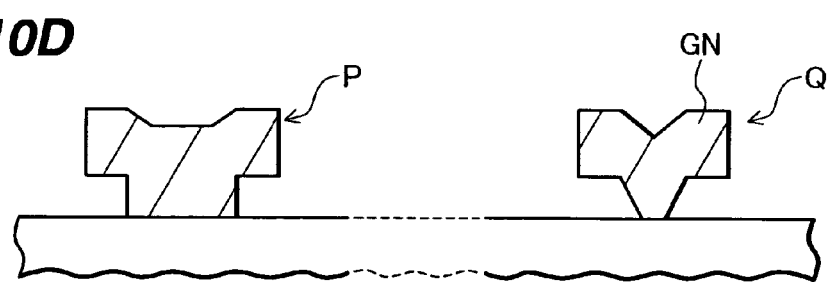

FIG. 10D shows the outline shapes of the gate electrode and thick finger. The circuit component P has a thick stem defined by generally upright side walls and constitutes, for example, a wiring line. The gate electrode GN of the transistor Q operating at high speed has a stem of a taper shape upward elongating the gate length.

In the embodiments shown in FIGS. 9A to 9E and FIGS. 10A to 10D, the laminated resist layers may be either three layers shown in FIG. 1E or two layers shown in FIG. 8. A resist pattern may be formed by exposure and development or by etching after the laminated resist layers are formed, or it may be formed by forming the lowest resist layer, patterning it, and thereafter forming the upper resist layer.

In the above embodiments, after a broad region is exposed as shown in FIG. 1E and developed as shown in FIG. 1F, a narrow region is exposed and developed as shown in FIG. 1G. Instead, a plurality of exposures may be performed first and thereafter the upper and lower resist layers are developed.

In the above embodiments, a resist layer to be tapered is made of PMMA. PMMA has a glass transition temperature of, for example, 165° C. As solvent of this resist material, ethyl cellosolve acetate (ECA, boiling point: about 170 to 180° C.), 140° C.+α), propylene glycol monomethyl ether acetate (PGMEA), boiling point: about 140° C.+α) and the like are known. Even if solvent having a high boiling point is used, it is preferable that baking and heat treatment of resist are performed at a glass transition temperature or lower of resist.

By using PGMEA as solvent, baking before exposure and heat treatment after development were performed in a temperature range of 120° C. to 150° C. In the whole temperature range, the taper shapes were formed. From these results, it can be considered that a desired taper shape can be obtained by performing baking and heat treatment at a glass transition temperature or lower.

The embodiments of the invention have been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device, comprising the steps in the following order:
   (a) preparing a semiconductor substrate having current input/output regions;
   (b) forming an insulating layer on the semiconductor substrate,
   (c) forming a resist laminate on the insulating layer;
   (d) forming an upper opening through an upper region of the resist laminate, the upper opening having a laterally broadening space in a middle portion of the resist laminate;
   (e) forming a lower opening through a lower region of the resist laminate, the lower opening communicating the upper opening, having a limited size along a current direction, and having generally vertical side walls;
   (f) etching the insulating layer exposed in the lower opening to form a gate electrode opening exposing the semiconductor substrate;
   (g) performing a heat treatment of the resist laminate to move the side walls of the lower opening so that at least one of opposite ends of the lower region of the resist laminate at the lower opening is retarded from a corresponding end of the insulating layer and that the lower opening of the resist laminate has a forward taper shape upwardly and monotonically increasing a size of the lower opening along the current direction; and
   (h) filling a gate electrode stem in the gate electrode opening and the lower opening and forming a head in the upper opening, the head having an expanded size along the current direction.

2. The method of manufacturing a semiconductor device according to claim 1, wherein the heat treatment in said step (g) is performed at a temperature lower than a glass transition temperature of the lower region of the resist laminate.

3. The method of manufacturing a semiconductor device according to claim 1, wherein the heat treatment in said step (g) makes the opposite side walls of the lower opening facing in the current direction have a generally symmetric taper shape and be retarded from opposite ends of the insulating layer.

4. A method of manufacturing a semiconductor device, comprising the steps in the following order:
   (a) preparing a semiconductor substrate having a plurality of element regions;
   (b) forming a resist laminate on the semiconductor substrate;
   (c) applying an energy beam to an upper region of said resist laminate for defining an upper opening in each of said plurality of element regions, and applying an energy beam to a lower region of said resist laminate in at least part of said plurality of element regions at a different dose depending on the element region;
   (d) forming the upper opening through the upper region of the resist laminate in each of the plurality of element regions, the upper opening having a laterally broadened middle space;

(e) forming a lower opening through the lower region of the resist laminate in each of the element regions, the lower opening communicating the upper opening, having a limited size along a first direction, and having generally vertical side walls;

(f) performing a heat treatment of the resist laminate to deform the side walls of the lower opening in at least some of the element regions in accordance with doses so that the lower opening has a taper shape upwardly and monotonically increasing a size of the lower opening along the first direction; and (g) filling a conductive stem in the lower opening and forming a head in the upper opening, the head having an expanded size along the first direction.

5. A method of manufacturing a semiconductor device, comprising the steps in the following order:

(a) preparing a semiconductor substrate having a plurality of element regions;

(b) forming a resist laminate on the semiconductor substrate;

(c) forming an upper opening through an upper region of the resist laminate in each of the plurality of element regions, the upper opening having a laterally broadening middle space;

(d) applying an energy beam to a lower region of the resist laminate in at least some of the element regions at a different dose corresponding to each element region;

(e) forming a lower opening through the lower region of the resist laminate in each of the element regions, the lower opening communicating the upper opening, having a limited size along a first direction, and having generally vertical side walls;

(f) performing a heat treatment of the resist laminate to deform the side walls of the lower opening in at least some of the element regions in accordance with doses so that the lower opening has a taper shape upwardly and monotonically increasing a size of the lower opening along the first direction; and (g) filling a conductive stem in the lower opening and forming a head in the upper opening, the head having an expanded size along the first direction.

6. A method of manufacturing a semiconductor device according to claim 1, wherein said semiconductor substrate has a plurality of element regions, each having current input/output regions, said step (d) forms an upper opening in each of the element regions, said steps (e) to (h) are performed on each of the element regions, further comprising the step of:

(i) between the steps (d) and (e), applying an energy beam to a lower region of the resist laminate at different dose depending on the element region.

7. A method of manufacturing a semiconductor device according to claim 6, wherein said step (g) forms the side walls of the lower opening having different taper angles.

8. The method of manufacturing a semiconductor device according to claim 1, wherein said step (d) includes the sub-step of:

(d-1) applying a first electron beam to an upper region of the resist laminate, registered with said upper opening.

9. The method of manufacturing a semiconductor device according to claim 8, wherein said step (d) further includes the sub-steps of:

(d-2) developing an upper portion of the resist laminate in the region applied with said first electron beam to form an upper window; and (d-3) etching a middle portion of the resist laminate through said upper window to form said laterally broadening space.

10. The method of manufacturing a semiconductor device according to claim 9, wherein said step (e) includes the sub-steps of:

(e-1) applying a second electron beam to a lower region of the resist laminate, registered with said lower opening, through said upper window and said laterally broadening space; and (e-2) developing an lower portion of the resist laminate in the region applied with said electron beam to form said lower opening.

11. The method of manufacturing a semiconductor device according to claim 10, wherein said step (c) contains the sub-steps of:

(c-1) coating a lower electron beam resist layer on the insulating layer;

(c-2) baking the lower electron beam resist layer below a glass transition temperature of the lower electron beam resist layer; and (c-3) coating a soluble resist layer on the lower electron beam resist layer, and coating an upper electron beam resist layer on the soluble resist layer.

12. The method of manufacturing a semiconductor device according to claim 11, wherein the heat treatment in said step (g) is performed at a temperature below a glass transition temperature of the lower electron beam resist layer.

13. The method of manufacturing a semiconductor device according to claim 12, wherein said forward taper shape has a general symmetric taper angle.

14. The method of manufacturing a semiconductor device according to claim 4, wherein said energy beam applied to the upper region and the lower region in said step (c) is electron beam.

15. The method of manufacturing a semiconductor device according to claim 14, wherein said step (e) includes the sub-steps of:

(e-1) applying an electron beam to a lower region of the resist laminate, registered with said lower opening, through said upper opening; and (e-2) developing a lower portion of the resist laminate in the region applied with said electron beam in said step (e-1) to form said lower opening.

16. The method of manufacturing a semiconductor device according to claim 5, wherein said energy beam in said step (d) is electron beam.

* * * * *